United States Patent [19]
Harris

[11] 3,979,664
[45] Sept. 7, 1976

[54] CAPACITOR DISCHARGE IGNITION TESTING APPARATUS EMPLOYING VISUAL SPARK GAP INDICATOR

[75] Inventor: Mark Harris, Brownsville, Wis.

[73] Assignee: Brunswick Corporation, Skokie, Ill.

[22] Filed: Mar. 3, 1975

[21] Appl. No.: 554,747

Related U.S. Application Data

[62] Division of Ser. No. 346,158, March 29, 1973, Pat. No. 3,891,917.

[52] U.S. Cl. .................................. 324/17; 324/122
[51] Int. Cl.² .......................................... G05F 1/16
[58] Field of Search .......................... 324/17, 18, 122

[56] References Cited
UNITED STATES PATENTS

| | | | |
|---|---|---|---|
| 1,187,670 | 6/1916 | Spofford | 324/17 |
| 2,482,016 | 9/1949 | McCoy | 324/122 |
| 2,482,017 | 9/1949 | McCoy | 324/17 |

Primary Examiner—Robert J. Corcoran
Attorney, Agent, or Firm—Andrus, Sceales, Starke & Sawall

[57] ABSTRACT

Capacitor discharge ignition analyzer includes a pulse source operable to generate electrical signals related to the input-output signals of various capacitor discharge ignition systems including battery driven and alternator driven systems. The analyzer includes an electronic circuit generating an output signal approximating that of the permanent magnet alternators for charging of alternator driven systems and a circuit to generate a trigger pulse. The output of the capacitor is connected to a spark gap unit having an outer enclosure with a small opening. This permits direct testing of the ignition system on the engine without any practical danger of generating explosions as a result of surrounding gas fumes.

4 Claims, 4 Drawing Figures

CAPACITOR DISCHARGE IGNITION TESTING APPARATUS EMPLOYING VISUAL SPARK GAP INDICATOR

This is a division of application, Ser. No. 346,158, filed Mar. 29, 1973, now U.S. Pat. No. 3,891,917, dated June 24, 1975.

BACKGROUND OF THE INVENTION

This invention relates to an ignition testing apparatus and particularly to such apparatus for dynamically analyzing the operation of capacitor discharge ignition systems.

Capacitor discharge ignition systems have been recently developed for operation of internal combustion engines. Generally, such systems employ a capacitor which is charged to a selected level and then selectively discharged to a spark plug for firing of the engine. The capacitor charging circuit may generally employ a battery and suitable D.C. to D.C. converter to charge the capacitor or, alternatively, may employ an engine driven alternator. A triggered blocking oscillator provides a highly satisfactory D.C. to D.C. converter, and preferably employs a solid state switching unit for initiating a charging cycle. The discharge circuit generally employs a control rectifier or other similar solid state threshold switching means for completing of a discharge circuit. A controlled rectifier and a pulsing transformer may be employed to provide for rapid transfer of the energy from the capacitor into the spark plug circuit.

A particularly satisfactory battery driven charging circuit employing a blocking oscillator is shown in U.S. Pat. No. 3,502,955 which issued Mar. 24, 1970 to F. Minks wherein the initiation of the charging cycle simultaneously establishes a discharge signal for firing of a control rectifier and discharging of the capacitor energy stored from a previous cycle. A saturable unit is provided to terminate the charging cycle and thereby transfer a predetermined constant amount of energy to the capacitor during each charging cycle to establish a closely regulated energy transfer per pulse to the spark plug.

The controlled rectifier of the discharge circuit is preferably actuated from a breakerless system. A preferred means includes a control oscillator which is switched on and off by a distributor driven apertured metal disc to generate successive pulses for simultaneously firing the controlled rectifier and triggering of the blocking oscillator circuit as more fully shown in U.S. Pat. No. 3,502,955.

Another satisfactory breakerless capacitor ignition system employs a magnetically driven differential amplifying circuit including a distributor driven rotating magnetic means to generate a series of triggering pulses as shown in U.S. Pat. No. 3,696,257 which issued Oct. 3, 1972 to Charles L. Shano. The pulse initiates operation of a charging circuit having a current level sensing resistor to provide for predetermined energy transfer to a capacitor. The trigger circuit is also connected to the input of the controlled rectifier to discharge the capacitor.

An alternator driven system may also take various forms. For example, U.S. Pat. No. 3,890,948, dated June 24, 1975, for "ALTERNATOR DRIVEN CAPACITOR POWER SYSTEM" discloses an alternator driven capacitor discharge ignition system wherein a dual winding alternator is provided for charging of a capacitor to a selected level at varying speeds, with one winding predominantly operating at a low speed range and the other winding predominantly operating during the high speed range. The capacitor is charged during one half-cycle of the alternator output and triggered during and in response to the negative half-cycle. Alternatively, a separate triggering alternator may be employed, particularly to provide a distributorless ignition. Thus, as shown in U.S. Pat. No. 3,566,188 which issued Feb. 23, 1971 to F. Minks, a separate trigger signal generator may be provided with separate triggering windings for connection to individual control rectifiers for selectively discharging of the capacitor energy into any one of a plurality of discharge circuits connected to corresponding individual spark plugs.

Further, particularly when the apparatus is applied to outboard motors and the like, the electronic circuitry is preferably potted in a suitable encapsulating plastic or the like to prevent damage to the components from the environment and also from vibration and the like. This, however, makes it extremely difficult to check the operation of the potted circuit.

Further, the capacitor discharge ignition systems as described employ electronic circuitry which requires significant knowledge and skill in electronics in order to properly evaluate the circuit. Generally, service personnel who have been servicing the more conventional breaker point system will not have the knowledge and skill to properly evaluate and service electronic ignition systems.

As a result, the servicing, maintenance and repair of an electronic ignition system has presented very significant practical problems and generally the switch units are returned to the factory if the service personnel determines that it is the ignition system that is preventing proper operation. Often, however, the system may be improperly evaluated because of the limited capabilities of the service personnel and the ignition failure improperly assigned to what is, in fact, a properly functioning unit.

SUMMARY OF THE INVENTION

The present invention is particularly directed to an ignition analyzer which permits dynamic analyzing of a plurality of different ignition systems such as those heretofore discussed and which permits such analysis with essentially a very minimum amount of knowledge or technical skill in electronics such as involved in the ignition system.

Generally, in accordance with the present invention the analyzer circuit includes electronic circuitry operable to generate electrical signals related to the input-output signals of the capacitor discharge ignition system to be analyzed. The several circuits are interconnected to an output means to permit selective interconnection of the output circuits into the trigger units and alternatively into the main charging circuit to individually and separately test the operation of such circuits.

The output characteristics of the capacitor firing network is analyzed by a spark gap element interconnected by the selection switch to the output of the main ingition charging capacitor or firing capacitor.

In accordance with a particularly novel and additional feature of the present invention, the spark gap unit is constructed with an outer enclosure having a small selected opening. This permits direct testing of the ignition system on the engine without any practical danger of generating explosions. Thus in the engine analysis, one must consider the fact that the engine may be in a bilge or other type of enclosure within which explosive fumes have accumulated. Any exposed spark would, of course, create an extremely hazardous condition. Applicant has found that the present invention can be applied in place with a high degree of safety to ignition systems for internal combustion engines such as in automobiles and recreation vehicles with minimum danger of creating an explosion while producing a detailed dynamic analysis of the characteristics.

Although the various circuits can be formed of various well-known and any desired construction to provide proper functioning, those described and shown in connection with the preferred embodiment provide certain advantages and novel construction features and are more fully developed hereinafter in connection with such description.

BRIEF DESCRIPTION OF THE DRAWINGS

The drawings furnished herewith illustrate a preferred construction of the present invention in which the above advantages and features are clearly disclosed as well as others which will be readily understood from the following description of such embodiment.

In the drawing.

DESCRIPTION OF THE PREFERRED ILLUSTRATED EMBODIMENT

Figures 1, 2, 4:
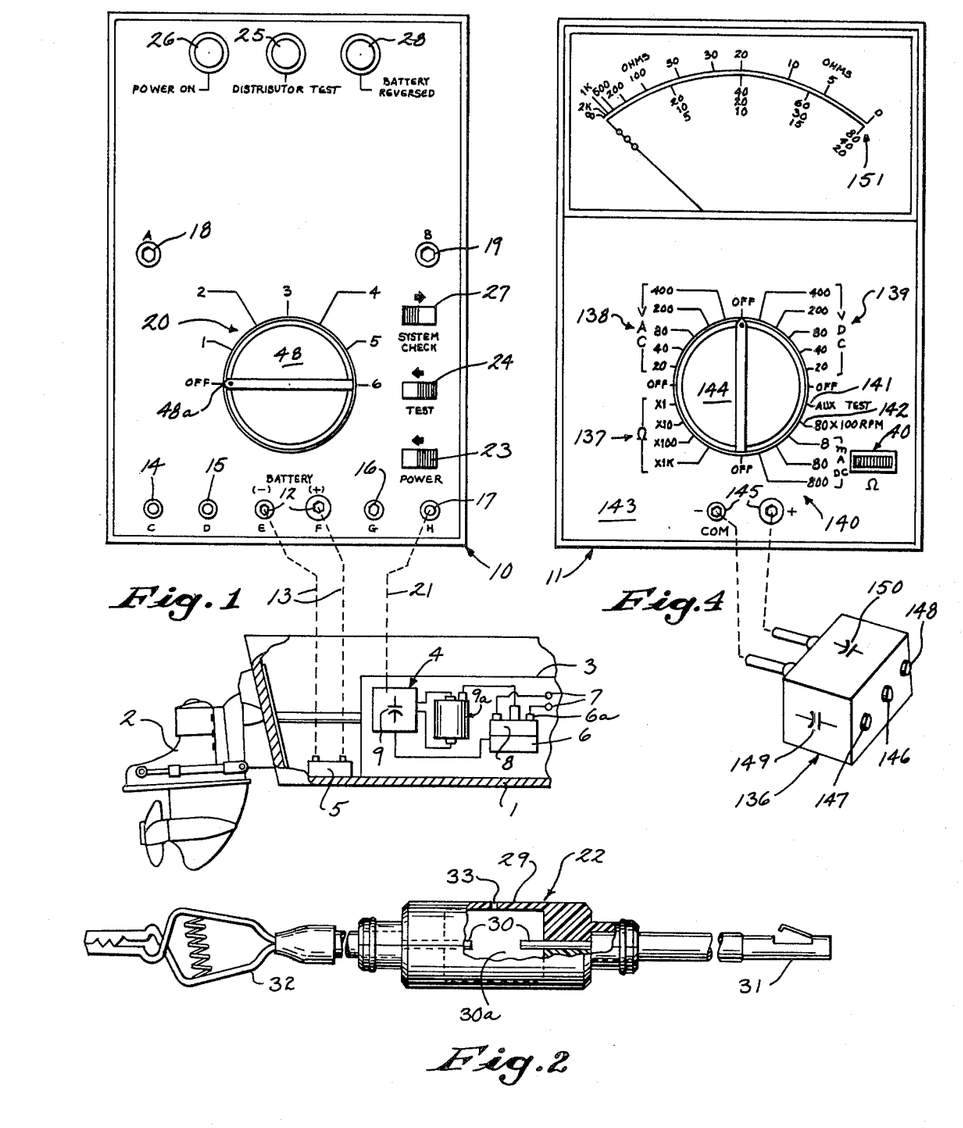
FIG. 1 is a diagrammatic illustration of an outboard motor boat including a stern drive and diagrammatically illustrating the interconnection of the ignition analyzer of the present invention.
FIG. 2 is an enlarged vertical section through a spark gap indicator for connection in FIG. 1.
FIG. 4 illustrates a voltage meter specially constructed for conjoint use with the ignition analyzer.

Referring to the drawing and particularly to FIG. 1 the invention is shown applied to a marine propulsion system including a pleasure boat 1 which is propelled by a stern drive unit 2. An internal combustion engine 3 is mounted inboard of the stern of the boat 1 and coupled in any conventional manner to drive the stern drive unit 2. The internal combustion engine 3 is provided with a capacitor discharge ignition system 4 of a battery driven variety and is normally connected to a battery 5 for deriving energy to fire the engine 3. The engine 3, of course, may be provided with an alternator for continuously charging of the battery 5 and the like in accordance with any well-known construction and such detail is not disclosed or or described herein. The output of the ignition 4 system is coupled through a distributor 6 for transfer of energy to the spark plugs 7. The distributor 6 includes a trigger or switch unit 8 which generates pulse signals operative to actuate a solid switch such as a controlled rectifier, not shown, and thereby selectively fire and transfer the energy from a capacitor 9 through the distributor to the appropriate spark plug 7. Capacitor 9 is normally connected to the distributor 6 through a pulse transformer 9a, with the output connected through suitable high voltage towers 6a to the spark plugs 7.

The capacitor discharge ignition system can take any one of a variety of forms. For example, the charging circuit may be as shown in U.S. Pat. No. 3,502,955 to Minks or U.S. Pat. No. 3,696,257 to Shano as previously described. Similarly, the distributing triggering circuit 8 may be specially constructed to provide for corresponding interrelated actuation of the discharge circuit and the charging circuitry for example as shown in U.S. Pat. No. 3,502,955 to Minks and U.S. Pat. No. 3,696,257 to Shano. In all such circuits, operation is similar in that the capacitor 9 is charged in response to initiation of start pulse to the charging circuit from the circuit 8 and simultaneously, the capacitor 9 is discharged to fire the spark plugs with the discharge circuit thereafter automatically establishing a blocking condition.

In accordance with the present invention, an ignition system dynamic analyzer 10 is provided which may be employed with the ignition system mounted in the normal manner within the boat. In addition, a static analyzing meter 11 (FIG. 4) is provided to further check the system if a fault is indicated by the dynamic testing.

Generally, the analyzer 10 includes an enclosing housing with the necessary connections and controls provided on the front panel. In particular a pair of input terminals 12 are provided for supplying DC power to the analyzer 10, and is especially constructed to permit connection as by special leads 13 to the boat battery. In addition, analyzer 10 includes a plurality of connecting jacks or other terminal means, including a pair of ground terminals 14 and 15 to one side of the terminals 12 and a third ground terminal 16 to the right-side of the battery terminals. A common function terminal 17 is provided for providing input-output connections. In addition, a further pair of output terminals 18 and 19 are provided as special output function terminals. These several terminals are provided to adapt the analyzer 10 to provide for dynamic checking of a plurality of ignition systems, in particular both the charging level and triggering aspects of such ignition systems. A selection switch 20 is centrally mounted on the front panel and is selectively movable between an off position and six selection positions, which are particularly related to the preferred circuitry shown in FIG. 3 and more fully described hereinafter.

Generally, terminal 17 defines a common input-output function control. Thus if it is desired to check the charging circuitry of the capacitor discharge ignition 4, the distributor trigger circuit 8 connection is removed and an auxiliary positive signal source is derived from the analyzer jack 17 to the ignition system via a jack lead 21. Thus the analyzer 10 is preferably provided with a plurality of similar jack and snap connection leads 21 which are color coded and also numbered or lettered in accordance with the position and location of the jacks to provide for a convenient method of instructing the operator in connection with checking of the ignition systems.

In addition, a special spark gap unit 22 is connected to the high voltage input tower of the distributor unit 8 and thus to the main ignition capacitor in series with the high voltage induction coil or transformer which is schematically shown in FIG. 1. The ignition analyzer includes a main power switch 23 which controls the basic interconnection of power from the battery 5 to the analyzer 10. Thus, the circuit lead connections are preferably made before the power is turned on. A separate test switch 24 is actuated and a trigger pulse signal is generated at the function terminal 17 which is applied to the CD ignition system for providing periodic discharge of the capacitor 9. Thus, if the ignition system charging and discharge circuit are functioning properly, the capacitor 9 will be periodically charged through the normal charging circuit and then discharged as a result of the receipt of a trigger signal via the lead 21 to develop a spark within the special unit 22.

If this part of the circuit is functioning properly then the trigger unit 8 can be separately checked.

Thus, the function terminal 17 is disconnected from the capacitor discharge ignition system 4 and connected directly to the output of the trigger unit 8. The engine is slowly turned over. If the trigger unit 8 is functioning properly, actuation of the test switch 24 will result in intermittent energization of the indicating lamp 25. The output of the trigger unit 8 thus drives the analyzer 10 and particularly a circuit which simulates the ignition system 4 and thus provides a check of the trigger circuit 8.

If both of the units appear to be operating properly the error obviously is in the ignition coil which can be checked through a separate meter as hereinafter described which is provided as part of the ignition analyzer 10.

The dynamic analyzer 10 is further provided with a power-on light or indicator, such as a lamp 26. In addition to ensure that the error is not in the dynamic analyzer, a special system check switch 27 is provided and connected to actuate the trigger testing circuitry and directly drive the lamp 25 or other indicator if the trigger test circuits are functioning properly. Actuation of the test switch 24, with the circuit otherwise disconnected from an ignition system for analyzing, will result in an audible hum as a result of the basic converter circuit operation, as presently described.

In addition, the dynamic analyzer includes a battery connection indicator, such as a lamp 28. Thus as noted in FIG. 1, the terminals 12 are marked pulse (+) and minus (−) and the analyzer 10 is polarity sensitive. If the battery is reverse connected to the analyzer 10, power is not supplied as the result of a special by-pass circuit. However, to ensure that the operator does not accidently insert the reverse connection and then attempt to use the analyzer 10 without checking the operation, the lamp 28 is provided to positively bring such error to his attention.

The special indicator 22 as more clearly shown in FIG. 2 is especially constructed to permit use of the ignition analyzer 10 directly in a boat and particularly within a confined area such as a bilge or the like wherein dangerous accumulation of explosive fumes may be encountered. Thus, the spark gap unit 22 includes an outer housing or shell 29 which may be formed of a suitable plastic material or the like with opposed spark gap leads or electrodes 30 projecting inwardly from the opposite ends and terminating in a predetermined gap 30a within the housing 29. The electrodes 30 are connected by suitable insulated leads to ends connectors shown as a suitable jack 31 adapted to be connected to the high voltage tower of the ignition transformer. An alligator clip 32 is connected to the opposite end to permit connection of the opposite end to a suitable ground connection or the like. In accordance with the present invention the enclosing housing 29 includes a very minute opening 33 which is especially selected to permit the arc within the enclosure and the escape of the resulting products without permitting significant entry of an explosive environment or propagation of the arc outwardly of the housing 29 into the environment with the resulting combustion of the gases in the surrounding environment. The spark is visually analyzed by providing housing with a light transmitting portion such as a clear plastic.

Figure 3:
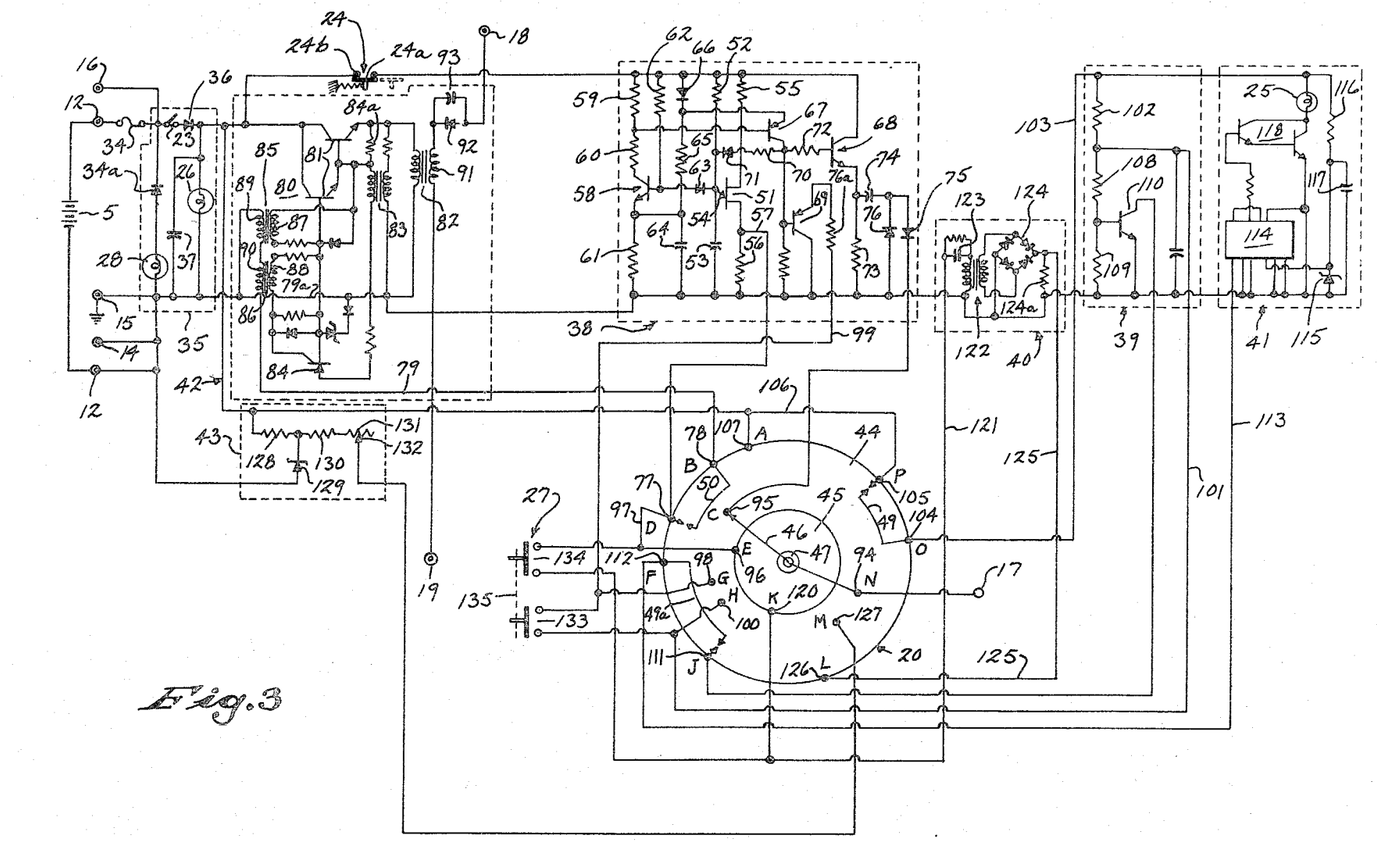
FIG. 3 is a schematic circuit diagram of a preferred construction of the ignition system analyzer.

Referring to the drawing and particularly to FIG. 3, a schematic of the ignition tester analyzer is illustrated in a preferred construction with the battery 5 connected to the terminals 12 and which particularly forms the subject matter of the parent of this application. As shown in FIG. 3, the positive terminal 12 is connected to supply positive power to the circuit through a fuse 34 with the jack 16 connected to the output side of the fuse 34 to provide a fused positive signal terminal 16.

The polarity indication lamp 28 is connected in series with a diode 34a across the power supply terminals 12 and the fuse 34. With the battery 5 properly connected as as shown, the diode 34a blocks the current through the indicating branch and lamp 28 is held off. If the battery 5 is inserted with the opposite polarity from that shown and thus improperly connected, the diode 34a conducts to illuminate lamp 28 and indicate the erroneous connection.

The one jack 12 is connected as a common ground to the jacks 14 and 15. Thus the jacks 14 through 16 are power connecting jacks. The jacks 17 through 19 are function jacks as hereinafter described in connection with the illustrated embodiment of the invention.

The circuit in FIG. 3 is shown generally broken-down to include a main on-off power control section 35 connected to the fused terminal 12 through the main on-off switch 23. A blocking diode 36 is connected in series with the switch 23 to prevent application of power to the circuit if the battery 5 is improperly introduced into the circuit. The lamp 26 is connected across the incoming power supply to the output side of the diode 36 and thus is illuminated when the battery is properly introduced and the power switch is turned on. This in turn provides power to the balance of the circuits.

The circuit further includes an AC or dual polarity pulse source 38 connected to the power supply and particularly the output side of the detection and control section 35 by the test switch 24. Thus, the source 38 is energized by operation of the test switch 24.

The test switch 24 is preferably a spring loaded switch unit having a manually controlled actuater of spring-loaded contact 24a which is spring biased to an open position with respect to a fixed contact 24b. The test switch 24 must therefore be held in closed position to maintain energization of the source 38. Basically, the source 38 is a converting means adapted to be coupled to the DC supply and producing an alternating output to provide the desired positive and negative pulse for operating of the ignition analyzer circuitry and the capacitor discharge ignition system 4, as more fully developed hereinafter.

The analyzer 10 further includes a pair of trigger pulse coupling circuits 39 and 40 interconnected through the selection switch unit 20 to a driving circuit 41 for the distributor test lamp 25. The circuit 39 is especially constructed to test distributor pulse generators such as shown in U.S. Pat. No. 3,696,257 while the circuit 40 provides a corresponding output for testing the output of the distributor circuit such as shown in U.S. Pat. No. 3,502,955.

In addition, an alternator driven test circuit 42 is provided and connected into the circuit through the selection switch unit 20 to be driven from the basic source or unit 38. The circuit 42 is employed in connection with alternator driven capacitor discharge ignition systems and in particular provides a means for simulating the output of the alternator for charging of a capacitor of such a system with suitable means provided for discharging of the capacitor.

Finally, a tachometer check circuit 43 is also shown in the preferred construction and selectively connected to the input power supply by the selection switch unit 20 to permit checking of tachometers employed with capacitor discharge ignition systems and the like and particularly those which are driven by the pulse output from the capacitor discharge ignition systems.

The subcircuits or elements 38 – 43 thus form the basic components which are selectively interconnected with the ignition components to provide for selective dynamic testing of the various components.

The illustrated selection switch unit 20 is a multiple contact wafer type unit having a rotary input for selectively interconnecting of the various contact terminals. The switch unit is diagrammatically illustrated in FIG. 3 as including a pair of different sized wafers 44 and 45 to permit simplified illustration of the switching unit. Generally, the wafer unit 44 and 45 will include a plurality of stacked elements with the several contacts suitable constructed and arranged to produce the circuit connections and as hereinafter described. As illustrated for purposes of discussion and explanation, the wafer switch unit 20 includes a first wiper 46 forming a common function output to the terminal 17. The wiper 46 is coupled to a drive shaft 47 which in turn is actuated by a rotating disc 48 having an indicating pointer 48a, as shown in FIG. 1. Contact wiper 46 is selectively positioned in engagement with any one of six different function contacts, the function of which is more fully developed hereinafter. In addition the switch unit includes a pair of wipers or contacts 49 and 49a, which are alternately positioned between a pair of contacts to provide selective circuit connections as also hereinafter described. A third wiper or contact 50 provides selective connection between two of the selection switch terminals when the control is moved from the off to the first position.

More particularly in the illustrated embodiment of the invention, the basic signal source circuit 38 is a free running relaxation oscillator having its input connected to the power supply through the test switch 24. The illustrated circuit includes a unijunction relaxation oscillator consisting of a unijunction transistor 51 periodically driven on and off through a conventional network including a resistor 52 in series with a capacitor 53, with the junction thereof connected to the emitter 54 of the unijunction transistor 51. Interbase electrode resistors 55 and 56 connect the corresponding electrodes to the D.C. power supply lines, with an output or signal line 57 taken from the topside of the base resistor 56. The unijunction oscillator functions in the conventional manner to establish a series of trigger pulses at line 57 whenever the test switch 24 is closed. These signals are employed to drive the alternator circuit 42.

The unijunction oscillator source 38 further controls a switching and driving circuitry to produce additional output signals. In particular, a delayed negative pulse signal is generated in spaced timed relation to the output of the unijunction transistor oscillator as follows. A switching transistor 58, shown as an NPN type has its emitter to collector circuit connected to the power supply in parallel with the unijunction transistor 51. Thus the collector is connected to the positive side in series with a pair of resistor 59 and 60. The emitter is connected to the negative or common ground line in series with a specially selected resistor 61. The base of the transistor 58 is connected through a coupling resistor 62 to the positive power supply and thus would normally be biased on. The base, however, is also connected through a steering diode 63 to the emitter of the unijunction transistor 51. Thus when the unijunction transistor 51 conducts, the emitter drops essentially to ground potential with the capacitor 53 fully discharged. This, in turn, drops the potential at the base of the transistor 58 causing it to turn off. This action is further ensured by a capacitor 64 connected in parallel with the resistor 61 and also connected to be charged from the positive supply line through a resistor 65 and a steering diode 66. With the transistor 58 off, the capacitor 64 will charge to the level determined by the voltage dividing action of the resistors 61 and 65. The resistor 61 is selected to be slightly larger than the resistor 65 and to establish a pulse width which is thirty to fifty percent of the total cycle duration. Thus when the base of the transistor is pulled down by the firing of the unijunction transistor 51, the transistor 58 is positively turned off until such time as the capacitor 53 charges to back bias the diode 63. At that time the voltage on the base rises to the level determined by the value of resistance 62 which is selected as a very high resistance element. Consequently the base rises above the positive charge on the capacitor 64 and the transistor 58 conducts.

An output switching transistor 67, shown as an NPN type, has its emitter connected to the output side of the diode 66 and its base connected to the topside of the resistor 60. Thus when the transistor 58 is turned on, emitter to base current flow is in turned created and turns on transistor 67. The collector of the transistor 67 is connected to simultaneously drive a pair of output transistors 68 and 69 and also to provide additional charging current to the unijunction transistor, via a coupling resistor 70 and a steering diode 71. Thus, once the transistor 58 is switched on to generate a positive output signal via the transistors 68 and 69 the charging rate of capacitor 53 is increased.

The transistor 68 is shown as an NPN type, and transistor 67 is shown as a PNP type. The transistor 68 has its base connected through a coupling resistor 72 to the collector of the transistor 67. The collector to emitter circuit is connected across the incoming power supply through the test circuit 24 with an emitter resistor 73 connected between the emitter and the common ground. A coupling capacitor 74 is connected to the emitter of the emitter follower transistor 68 and provides a output signal at a predetermined time after the unijunction transistor 51 has established an output pulse signal. The output signal is connected through a diode 75 as a pulse signal upon charging of the capacitor 74. When the transistor 68 turns off, the capacitor 74 discharges through the emitter resistor 73 and a discharge diode 76 connected across the resistor 73 and the capacitor 74. simultaneously with the generation of the pulse signal at the follower transistor 68, the transistor 69 is turned on and completes an output circuit through a resistor 76a which is connected into the circuit through the selection switch 20.

More particularly with the selection switch unit 20 connected to the number one position, the pulse source 38 is connected to actuate the alternator drive circuit 42, as follows. The switch unit 20 includes a contact 77 connected by the wiper 50 to a contact 78 with the switch unit rotated to the first position, as shown in full line illustration. The contact 77 is connected to the output terminal lead 57 of the unijunction transistor 51. The interconnected contact 78 is connected via a signal lead 79 as an input signal to the circuit 42. The output of the unijunction transistor 51 which appears at line 57 is connected to a trigger and initiate a cycle of operation to cyclically operate the circuit 42.

The circuit 42 is a triggered blocking oscillator circuit 80 generally constructed in accordance with the teaching of the blocking oscillator circuit of the U.S. Pat. No. 3,502,955. Thus, the blocking oscillator circuit 80 includes a pair of Darlington connected transistors 81 connected across the incoming power supply 35 to the output side of the diode 36. The transistors 81 are connected in a series charging circuit with a coupling transformer 82 and a saturable cutoff transformer 83 having a primary which is connected in parallel with the primary of the transformer 82. The transistors 81 are biased on through special biasing circuits similar to that shown in the above patent and connected in a feedback network including the secondary of the transformer 83. Thus a controlled rectifier 84 is connected in series with the secondary of the transformer 83 and a coupling resistor 84a across the base to emitter circuitry of the Darlington circuit 81. The input transistor of the Darlington pair 81 and the control rectifier 84 are simultaneously driven on to initiate a charging cycle. Thus a pair of pulse transformers 85 and 86 are provided with the respective secondaries connected across the base to emitter circuit to the one Darlington pair transistor 81 and across the gate to cathode circuit of the control rectifier 84. The primary windings 89 and 90 of the transformer 85 and 86 are connected in series between the line 79 and the common return line 79a of the circuit. The line 79 as previously noted is connected to the output of the pulse forming of the circuit 38 through the selection switch unit 20 with the latter in the first position. Suitable resistor diode networks are connected in the circuits of the secondaries 87 and 88 and in the feedback network to maintain the desired proper operation of the blocking oscillator under normal operating condition. The various components of the blocking oscillator 80 are particularly selected to generate an output signal in the transformer 82 which closely follows the initial portion of the conventional permanent magnet alternator widely employed in alternator driven capacitor discharge ignition systems. Thus such alternators do not produce a true sine wave output but a rather steeply distorted alternating wave which can be closely approximated by the blocking oscillator circuit.

The output therefore closely simulates the output of the alternator at least during the significant charging portion of the cycle. The transformer secondary 91 of the transformer 82 is connected in series with a diode 92 to the output jacks 18 and 19 of the analyser 10. In addition, a small capacitor 93 is connected in parallel with the diode 92. The capacitor 93 is selected to allow a very small portion of the negative cycle generated when the blocking oscillator turns off to produce a small negative pulse signal across the jacks 18 to 19, and permits testing of ignition system such as shown in the previously identified patent application. The output jacks 18 and 19 are connected through suitable coupling leads to the ignition system and particularly to the input side of the main capacitor in place of the normal alternator connection. The circuit 42 thus replaces the alternator and provides a positive charging signal to first charge the main firing capacitor 9 to a selected level and shortly thereafter a negative pulse signal which is passed as a result of the capacitor 93 to trigger the controlled rectifier of this CD ignition system and discharges the main capacitor of the ignition system through the spark gap unit 22. Thus if the capacitor charging circuit and discharging circuit are functioning properly a spark is generated.

The spark gap unit 22 is installed with the jack connected to the high voltage tower of the ignition transformer and the opposite side connected to engine ground. The input leads from the alternator to the switch box are removed and replaced with connecting leads from the jacks 18 and 19. The power is of course turned on and the test button switch 24 closed. If the system is in proper functioning order, a spark will be generated in the spark gap unit 22 indicating proper system operation. If a spark is not obtained, it indicates that either the switch box or the ignition coil are defective. This can be checked as hereinafter described by the use of separate meter assembly or unit. If the analyzer 10 indicates proper functioning and ignition is still not obtained, the windings of the alternator are separately checked with the separate meter. The other components, of course, can also be checked, if all of the electrical components appear to be operating.

In some alternator driven systems, as heretofore discussed, and, for example, as shown in U.S. Pat. No. 3,566,188 a separate trigger pulse circuit is employed for discharging of the ignition system. For those systems the alternator output terminals or jacks 18 and 19 are connected to the switch box to replace the normal charging circuit from the alternator. The trigger input is derived from the common analyzer function terminal or jack 17, which is connected by a suitable connecting lead to the trigger terminal on the switch box. The terminal 17 is connected to a switch contact 94 which in turn is connected to the common wiper contact 46. In the first position, the contact 46 is aligned with and makes contact with a terminal 95 which, in turn, is connected to the output of the source 38 and particular is connected via a lead to the output diode 75 of the transistor 68 of source 38.

As previously noted, the source 38 functions through the control of the unijunction oscillator circuit to generate a pulse at the output lead 57 which is connected through the switch terminals 77 and 78 to initiate operation of the circuit 42 which simulates the charging cycle of the alternator. Consequently, the capacitor of the ignition system is charged from the output at terminals or jacks 18 and 19. The initiation of the pulse signal by the unijunction oscillator also drives off the delay switching transistor 58 which is held off for a predetermined time period equal to 30 to 50 percent of the pulse duration after which it automatically turns on and through the transistor 67 actuates the transistors 68 to establish an output pulse which is transmitted via the diode 75 and terminal 95 to the wiper 46 and common function contact 94 to the jack 17 thereby introducing a pulse signal to the switch box to discharge the capacitor 9 into the pulse of the spark gap unit 22 if indeed the system is operating properly.

If for any reason the dynamic test fails to produce a spark thereby indicating dynamic failure, the ignition system may be further static tested by the separate meter 11 to determine whether in fact the ignition switch box or the transformer is faulty. If the total ignition system then checks out proper, it would indicate that the error is in the stator circuit or the trigger circuit. The stator coils can be checked through the use of the static meter 11 particularly for grounds and open circuits. The trigger circuit can be checked by merely inserting of the spark gap into the trigger coil and manually operating the engine to indicate whether or not a spark is obtained. The static test can also be applied to the trigger circuit to determine whether or not the trigger coil of the alternator is open or grounded.

The circuit 42 thus provides a simulated alternator circuit which individually and in combination with the source 38 permits essential testing of various alternator driven capacitor discharging ignition systems. Most permanent magnet alternators generate similar output charging currents and consequently the unit can be readily applied to the various units. It is, however, desirable constructed to conform to the characteristics of a desired commercial unit, for example, for a given manufacturer to thereby permit highly accurate analysis of the corresponding ignition systems.

The present invention provides a dynamic test in that it provides the actual function of making a visual spark which permits evaluation of the ignition ability of the system. Further through the separate meter system, as hereinafter described, it also permits evaluation of the output in energy levels to determine the precise characteristic of the system.

In the illustrated second selection switch position, analyzer 10 is adapted to drive a capacitor discharge ignition system such as shown in U.S. Pat. No. 3,502,955 to Minks to determine whether or not the capacitor is being charged from the battery and at a proper level by discharging of such circuit through a positively established trigger pulse from the analyzer 10 to the capacitor discharge ignition system. Thus in the second position, the switch unit 20 rotates the common wiper 46 into engagement with a contact 96 which is connected by a jumper lead 97 to the contract 77 and therefore directly to the output of the unijunction oscillator lead 57 of circuit 38. The output pulse is thus supplied via the common function terminal 94 to the jack 17. Although the power pulse is also applied to the terminal 77 the rotation of the switch unit opens the circuit of terminal 77 to terminal 78 by movement of the wiper contact 50, thereby removing power from the circuit 42. In this position, the analyzer 10 is solely employed to generate the necessary time spaced pulse signals at the common terminal or jack 17 which is connected through a proper lead to the trigger input of the switch box for the capacitor discharge ignition system. In this test, the spark gap unit 22 is connected between the high voltage transformer tower and ground to substitute the special spark unit 22 for the ignition output. The trigger lead is separated from the distributor unit 8 and replaced with the connection of a special test lead 21 to the jack 17. The switch unit 20, as previously noted, is in the number two position. The ignition key of the ignition unit is turned on along with the power button switch 24 of the analyzer 10. The turning on of the ignition key should charge the capacitor 9 of the discharge ignition system. When the test button switch 24 is actuated a series of pulses is generated from the analyzer 10 to the switch box causing it to periodically be triggered to discharge. Between the discharge periods, the main capacitor 9 should charge through the normal circuitry. If a spark appears in the spark gap unit 22, the box and associated transformer coils are good. If a spark does not appear, the system is analyzed through the use of the meter 11 to determine whether or not it is the switch box or the coil which is in need of repair. The trigger circuit may be analyzed with the selection switch unit 20 in the number 5 position and consequently this part of the description of the circuit is subsequently set forth.

In the third position of the selection switch unit 20 the output of the circuit or source 38 is interconnected for driving of an alternate capacitor discharge ignition system such as that shown in U.S. Pat. No. 3,696,257 to Shano. Thus in the third switch position, the common wiper contact 46 moves into engagement with a contact 98 of the switch unit 20 which is connected via a resistor 76a to the transistor 69 via a third output line 99 of the source 38. Thus as previously described this circuit provides a ground return via the transistor 69 which is selectively turned on and off by the cascaded energization of the transistors 58 and 67. As previously noted, firing of unijunction relaxation oscillator actuates transistors 58 and 67 to deenergize transistor 69. A predetermined time thereafter, the transistor 58 again turns on to drive the transistor 67 on, thereby connecting power from the output side of test switch 24 through diode 66 and the emitter-collector circuit of the transistor 67 to the base circuit of the transistor 69, thereby controlling transistor 69 and the completion of the ground return circuit through the resistor 76a.

This ground return circuit is thus completed through the switch unit 20 and particularly contact 98 and common wiper 46 to the common function contact 94 which is connected to the common function jack 17. This, in turn, is connected to the trigger terminal of the capacitor discharge ignition system and in particular provides a complete circuit to complete the input to the switching circuitry to initiate a charging cycle which, as previously noted, simultaneously initiates a discharge pulse signal the energy stored in the capacitor. Thus if the charging circuit of this capacitor discharge ignition system is operating properly a spark will appear in the spark gap unit 23. If the system is not operating properly the spark will not appear and the system should then be checked with the static meter 11 to determine whether or not the switch box or the coil unit is defective.

In summary, with switch unit 20 in the third position, the output of the source 38 creates a series of pulse signals coupled by the switch to the common function terminal 17, which is applied to the ignition system circuit in place of the breaker-pointless distributor unit 8. The resistor 76a is specially selected to provide a matching impedance characteristic to that of the input oscillator of U.S. Pat. No. 3,969,257. This ensures that the input signal to the system is essentially that of the actual ignition unit such that the firing to form a spark in the analyzer unit 22, one can with a great deal of confidence assume that the switch box is in proper function and working order. If a spark is not obtained, the system is analyzed by the meter 11 to determine whether the switch box 4 or the coil as such is defective.

As previously noted, in addition to the discharging of a capacitor through a distributor for a multiple cyclinder engine, a breakerless systems may advanagetially provided employing a separate trigger pulse generating signal systems operated in synchronism with the engine. Positions 4 and 5 are selected to provide accurate analysis of two different trigger pulse systems and in particular such as shown in previously referred to U.S. Pat. Nos. 3,696,257 and 3,502,955.

Thus in the fourth switch position, the analyzer 10 is connected to check the characteristic of the magnetically responsive differential amplifier trigger source such as shown in U.S. Pat. No. 3,696,257. To analyze this system, the normal ignition terminal lead is removed from the unit 8 and interconnected through a special lead 21 to the function terminal or jack 17. The output of the trigger unit 8 is now applied to the analyzer 10. The wiper contact 46 engages the contact 100 and provides for transfer of energy into the analyzer which is connected to drive the associated coupling circuit 39 via a lead 101.

The output of circuit 38 is connected through the selection switch unit 20 to drive the indicating circuit 41. Thus the circuit 39 includes a resistor 102 connected between the lead 101 and a power supply lead 103 which is connected to a contact 104 of the selection switch unit 20. The contact 104 is connected by the wiper 49 to a contact 105 or a spaced contact 107 connected in common to a power lead 106 from the positive side of the output of the power indicating circuit 35 and particularly the diode 36. Thus the resistor 102 is connected in series between the positive side of the power supply and the trigger pulsing circuit to establish current flow through the circuit if the trigger unit 8 is functioning properly and providing a pulse output of sufficient magnitude to drive the circuit. In particular, the resistor 102 is especially selected to correspond to the driving resistance of the distributor unit 8 to thereby produce precise correspondence between the two systems.

A voltage dividing network consisting of a pair of resistors 108 and 109 are connected in parallel with the output of the trigger unit 8 with a voltage corresponding to that across the trigger unit 8 with the junction of the resistors being connected as the input to an indication driver transistor 110, shown as an NPN type. The emitter to collector circuit of the transistor 110 is connected between the common reference line of the analyzer and a terminal 111 of the selection switch unit which in the fourth position is connected via the wiper 49a to the contact 112. The contact 112 is connected by a common input line 113 as a driving input to the indicating circuit 41.

This circuit particularly includes a small counting circuit 114 having its input connected to the line 113 and thus driven to count the incoming pulse signals. It divides the rapidly incoming pulse signals which result from the operation of the trigger circuit and reduces them to a substantially smaller number with the output of the counting circuit 114 connected to drive the indicating lamp 25. The counting circuit requires a low voltage supply and in the illustrated embodiment of the invention a Zener diode 115 in series with a resistor 116 and paralleled capacitor 117 is connected across the supply with the junction connected as the input of the counting circuit 114 to reduce the voltage to the required level. Thus the counting circuit may require a 5 volt input and the Zener diode may be selected to establish and maintain such input.

The lamp 25 is connected to the power supply in series with a Darlington transistor switch unit 118, the input of which is connected across the output of the counting circuit. Thus each selected number of input pulses to the counting circuit actuates, the switch 118 to result in corresponding illumination of lamp 25. The lamp 25 will blink on and off if the trigger circuit is functioning properly to drive the circuit 39.

In a distributor test, the power switch 23 is closed to supply power to the circuits of the analzyer 10 and the related engine 3 is operated by the starter, without actually starting the engine. If the distributor functions at cranking speed to properly trigger the circuit, one can be assured that it will properly function under operating condition. If the light remains on or off, the distributor circuit needs to be replaced. Thus the output of the counter may initially be in either one of two logic states and consequently provide for continuous illumination or no illumination and it is the blinking which directly indicates the condition of the distributor circuit in the illustrated embodiment.

The alternate circuits such as shown in U.S. Pat. No. 3,502,955 are similarly checked in the next or fifth position of the analyzer selection switch unit 20 in the illustrated embodiment of the invention through a connection to coupling or load matching circuit 40, as follows.

In the fifth switch position, the selection switch unit 20 interconnects common wiper contact 46 to a contact 120 which is connected via a lead 121 to the coupling or load matching circuit 40.

The coupling circuit 40 includes an input transformer 122 having a specially selected primary 123 connected in series with the line 121 to the common ground reference of the analyzer circuit. The primary 123, in particular, is selected to precisely match the load impedance applied to the trigger output of the pulse driven transformer system. Thus, in U.S. Pat. No. 3,502,955, individual pulse transformers are series connected and employed to correspondingly and simultaneously turn on a capacitor charging circuit and fire a controlled rectifier for discharging of the capacitor energy which had been previously stored therein. In accordance with the present invention, the transformer 122 is selected to match the impedance of those input transformers. The output of the transformer 122 is full wave rectified by a diode rectifier unit 124 with a resistor 124a equivalent to the load applied to the input transformers. Consequently, if the trigger circuit properly drives the coupling circuit 40, it will properly drive the ignition system. The output of circuit 40 is connected to a line 125 for coupling through the selection switch unit 20 to the driving input line 113 of the indicator circuit 41. Thus, the lead 125 is connected to the terminal 126 of the selection switch unit 20 which is not connected by the common wiper lead 49a to the coupling terminal 112 which is connected as the input to the indicating circuit 41 via lead 113, as previously described.

Thus, if the trigger source or unit 8 is functioning properly to drive the transformers of the main capacitor charging and discharging circuit, it will also drive the coupling circuit 40 to actuate the indicating circuit 41 and the lamp 25 will blink on and off. If it is not so functioning the trigger circuit is defective and should be replaced.

Thus, in summary, the analyzer is especially constructed for basic types of ignition systems and in the illustrated embodiment of the invention, the several circuits are especially provided to drive the main charging and discharging circuits as well as the trigger circuits of the particularly referred to type of system. To provide for variations in such circuits which might be employed the impedance matching units can, of course, be made adjustable to permit accurate matching to those particularly referred to as well as still other generally similar circuits.

Similarly, the alternator driven systems can employ variable elements to permit matching to any particular characteristic. Further, although the present analyzer is particularly directed to systems such as shown in the referred to patents, the analyzers may also be applied to other systems with the accuracy of analysis is directly related to the degree the characteristics are similar or dissimilar.

In addition, the dynamic analyzer 10 may be employed to check a pulse driven tachometer such as shown in U.S. Pat. No. 3,502,955. Thus, in the sixth position of the analyzer selection switch 20, the common wiper contact 46 interconnects the function terminal 17 to a sixth contact 127 which is connected to the tachometer drive check circuit 43. To check a tachometer, the function jack 17 is connected to the positive terminal on the tachometer and the ground side of the tachometer is similarly connected to the ground jack 14. The tachometer drive circuit 43 couples the tachometer to the analyzer power supply. Thus, a resistor 128 in series with a Zener diode 129 is connected between the positive side of the analuzer power supply circuit 35 and the common ground return. It thus establishes a reference voltage at the junction of the resistor 128 and the diode 129. A potentiometer circuit is connected between this junction and the terminal 127 and includes, in the illustrated embodiment of the invention, a fixed resistor 130 in series with a variable resistor 131 having a movable tap 132 connected to terminal 127. The tap 132 provides for a factory adjustment of the resistance. The tachometer must be disconnected from the normal ignition drive circuit in order to ensure proper introduction of the test signal into the tachometer. When the power switch 23 is turned on, the voltage applied establishes a related RPM reading. If the reading is within a given tolerance, the tachometer should be replaced or repaired. Thus, in a practical application, it may be made to read between 48 and 5200 revolutions per minute.

The illustrated selection switch unit 20 also provides an interconnection through check switch 27 for self-checking of the analyzer 10. Thus, as shown in FIG. 3, switch 27 is a double pole, single throw switch unit having a first normally open switch 133 and a second normally open switch 134 connected to a common actuator 135 as shown by the dashed coupling lines in FIG. 3. The switch 133 connects the terminals 96 and 120, while switch 133 similarly connects the contacts 98 and 100 of the selection switch unit 20. This, in essence, interconnects outputs of the pulse source 38 as the input to the trigger checking circuits and particularly circuits 39 and 40, with the selection switch unit correspondingly positioned in the fourth and fifth positions. In a self-checking operation, the selection switch unit 20 is turned to the first position with the battery properly connected to the analyzer 10 and with the power switch 23 on. The test button switch 24 is actuated and must be manually held closed for the duration of the test, as a result of the spring loading to a normally open position.

The test switch 27 is similarly constructed as a spring loaded device. Further, switches 24 and 27 are preferably sliding button switch devices as shown in FIG. 1, with the buttons oppositely positioned for directly opposite movement to minimize the erroneous selection of the self-test switch for the analyze switch.

If the converter 38 is working properly a low pitched noise will be heard as a result of the oscillator action of the source 38, in the number one position.

The output of the triggering circuits associated with positions four and five are checked by turning the selection switch unit 20 to a corresponding position and then actuating the system check switch 27 while simultaneously actuating of the test switch 24. Source 38 generates triggering pulses connected via switches 133 or 134 to drive the connected coupling circuit 39 or 40 and thereby the indicating circuit 41. Thus, in the fourth switch position, a signal from the transistor 69 of the source 38 is coupled through the switch contacts 133 to the lead 101 which, in turn, drives the circuit 39 the output of which is connected through the previously described switching circuit and contact 111 of unit 20 to drive the indicating circuit 41.

In the fifth switch position, the signal on lead 57 of source 38 is connected by contacts 134 to the selection contact 120 and 121 to the input of the matching circuit 40, the output of which is connected by a lead 125 and the selection switch unit 20 to drive the circuit 41.

Thus in each position if the corresponding distributor test circuit is operating properly, the indicating lamp 25 will blink on and off.

The apparatus is relatively small and mobile and with the special spark gap unit can, with appropriate equipment maintenance, be readily employed within a boat without explosion danger resulting from accumulation of normal explosive fumes in the boat and test area.

Various modes of carrying out the invention are contemplated as being within the scope of the following claims, particularly pointing out and distinctly claiming the subject which is regarded as the invention.

I claim:

1. A spark gap unit for an ignition testing apparatus providing on site testing of capacitor discharge ignition systems for internal combustion engines comprising a pair of spark gap electrodes mounted in spaced relation and having input power connection means, an enclosing housing enclosing the ends of the electrodes and the gap therebetween, said housing providing an essentially fluid tight enclosure, said housing including a small passageway means permitting a restricted fluid interchange between the inside and outside of the housing and restricting the propagation of a spark from between the electrodes outwardly of the housing while permitting the escape of gases from within the housing.

2. The spark gap unit of claim 1 wherein said housing includes a light transmitting portion to permit visual analysis of the spark in said gap between said electrodes.

3. The spark gap unit of claim 1 wherein said housing is a tubular member having the electrodes secured in the opposite ends thereof and extending into the housing, connecting cable means connected to said electrodes.

4. The spark gap unit of claim 3 wherein said minute opening is located centrally of the length of the housing and thus generally centrally of the location of the gap between said electrodes.

* * * * *

UNITED STATES PATENT AND TRADEMARK OFFICE
CERTIFICATE OF CORRECTION

PATENT NO. : 3,979,664
DATED : September 7, 1976
INVENTOR(S) : MARK HARRIS

It is certified that error appears in the above-identified patent and that said Letters Patent are hereby corrected as shown below:

| | | | |
|---|---|---|---|
| Column 3, | Line 53, | after "disclosed" cancel "or" (first occurrence); |
| Column 6, | Line 16, | before "shown" cancel "as" (second occurrence); |
| Column 7, | Line 23, | after "contacts" (end of line) cancel "suitable" and insert --- suitably ---; |
| Column 7, | Line 68, | cancel "resistor" and insert --- resistors ---; |
| Column 8, | Line 34, | before "created" cancel "turned" and insert --- turn ---; |
| Column 8, | Line 59, | cancel "simultaneously" and insert --- Simultaneously ---; (beginning of a sentence) |
| Column 10, | Line 42, | before "particular" insert --- in ---; |
| Column 11, | Line 18, | beginning of the line cancel "sirable" and insert --- sirably ---; |
| Column 12, | Line 38, | after "pulse signal" insert --- to discharge ---; |
| Column 12, | Line 53, | cancel "3,969,257" and insert --- 3,696,257 ---; |

UNITED STATES PATENT AND TRADEMARK OFFICE
CERTIFICATE OF CORRECTION

PATENT NO. : 3,979,664
DATED : September 7, 1976
INVENTOR(S) : MARK HARRIS

It is certified that error appears in the above–identified patent and that said Letters Patent are hereby corrected as shown below:

Column 12, Line 54, after "breakerless" cancel "systems may advanagetially" and insert --- system may be advantageously ---.

Signed and Sealed this

Third Day of May 1977

[SEAL]

*Attest:*

RUTH C. MASON
*Attesting Officer*

C. MARSHALL DANN
*Commissioner of Patents and Trademarks*